US009048329B2

(12) United States Patent
Kim et al.

(10) Patent No.: US 9,048,329 B2
(45) Date of Patent: Jun. 2, 2015

(54) INTEGRATED CIRCUIT MEMORY DEVICES HAVING VERTICAL TRANSISTOR ARRAYS THEREIN AND METHODS OF FORMING SAME

(71) Applicants: Ji-Young Kim, Los Angeles, CA (US); Kang L. Wang, Santa Monica, CA (US); Yong-Jik Park, Suwon-si (KR); Jeong-Hee Han, Hwaseong-si (KR); Augustin Jinwoo Hong, Los Angeles, CA (US)

(72) Inventors: Ji-Young Kim, Los Angeles, CA (US); Kang L. Wang, Santa Monica, CA (US); Yong-Jik Park, Suwon-si (KR); Jeong-Hee Han, Hwaseong-si (KR); Augustin Jinwoo Hong, Los Angeles, CA (US)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/024,737

(22) Filed: Sep. 12, 2013

(65) Prior Publication Data

US 2014/0015032 A1    Jan. 16, 2014

Related U.S. Application Data

(63) Continuation of application No. 12/816,771, filed on Jun. 16, 2010, now Pat. No. 8,541,832.
(60) Provisional application No. 61/227,863, filed on Jul. 23, 2009.

(30) Foreign Application Priority Data

Dec. 8, 2009    (KR) .................. 10-2009-0121107

(51) Int. Cl.
  *H01L 29/792*    (2006.01)
  *H01L 27/115*    (2006.01)
(52) U.S. Cl.
  CPC ...... *H01L 29/7926* (2013.01); *H01L 27/11575* (2013.01); *H01L 27/11578* (2013.01); *H01L 27/11582* (2013.01); *H01L 29/792* (2013.01)

(58) Field of Classification Search
  USPC ............ 257/324, 314, E29.309, E27.103, 43, 257/E29.255, E29.068, E29.3, 4, E21.46, 257/E29.262, 421, E21.409, E27.084, 257/E29.273, E29.296, E45.002, 2, 288, 257/296, 300, 316, 5, 741, 774, E21.002, 257/E21.09, E21.214, E21.334, E21.411, 257/E21.422, E21.461, E21.473, E21.476, 257/E21.521, E21.529, E21.536, E21.54, 257/E21; 365/185, 18, 185.18, 185.25, 365/185.27, 185.14
  See application file for complete search history.

(56) References Cited

U.S. PATENT DOCUMENTS

| 5,946,230 A | 8/1999 | Shimizo et al. |
| 6,274,413 B1 | 8/2001 | Fang et al. |

(Continued)

FOREIGN PATENT DOCUMENTS

| JP | 06-338602 | 12/1994 |
| JP | 10-093038 | 4/1998 |

(Continued)

OTHER PUBLICATIONS

Fukuzumi at al., "Optimal Integration and Characteristics of Vertical Array Devices for Ultra-High Density, Bit-Cost Scalable Flash Memory," 2007 IEEE, pp. 449-452.

(Continued)

*Primary Examiner* — Robert Bachner
(74) *Attorney, Agent, or Firm* — Myers Bigel Sibley & Sajovec, PA

(57) ABSTRACT

An integrated circuit device includes a transistor array having a vertical stack of independently controllable gate electrodes therein. A first semiconductor channel region is provided, which extends on a first sidewall of the vertical stack of independently controllable gate electrodes. A first electrically insulating layer is also provided, which extends between the first semiconductor channel region and the first sidewall of the vertical stack of independently controllable gate electrodes. Source and drain regions are provided, which are electrically coupled to first and second ends of the first semiconductor channel region, respectively.

9 Claims, 23 Drawing Sheets

(56) References Cited

U.S. PATENT DOCUMENTS

| | | | |
|---|---|---|---|
| 6,380,032 B1 | 4/2002 | Lee et al. | |
| 6,483,749 B1 | 11/2002 | Choi et al. | |
| 6,870,216 B2 | 3/2005 | Hsiao et al. | |
| 6,933,556 B2 | 8/2005 | Endoh et al. | |
| 7,382,018 B2 | 6/2008 | Kim et al. | |
| 7,539,056 B2 | 5/2009 | Katsumata et al. | |
| 8,102,711 B2 | 1/2012 | Maejima | |
| 8,278,170 B2 | 10/2012 | Lee et al. | |
| 2002/0072167 A1 | 6/2002 | Lee et al. | |
| 2006/0125029 A1 | 6/2006 | Kanda | |
| 2007/0012979 A1 | 1/2007 | Song et al. | |
| 2007/0158736 A1* | 7/2007 | Arai et al. | 257/315 |
| 2007/0173000 A1 | 7/2007 | Yamazaki | |
| 2007/0252201 A1 | 11/2007 | Kito et al. | |
| 2008/0029811 A1 | 2/2008 | Yun et al. | |
| 2008/0067583 A1 | 3/2008 | Kidoh et al. | |
| 2008/0073635 A1* | 3/2008 | Kiyotoshi et al. | 257/2 |
| 2008/0135912 A1 | 6/2008 | Lee et al. | |
| 2008/0173928 A1 | 7/2008 | Arai et al. | |
| 2008/0253183 A1 | 10/2008 | Mizukami et al. | |
| 2009/0020744 A1 | 1/2009 | Mizukami et al. | |
| 2009/0090960 A1 | 4/2009 | Izumi et al. | |
| 2009/0173981 A1 | 7/2009 | Nitta | |
| 2009/0242968 A1 | 10/2009 | Maeda et al. | |
| 2009/0268524 A1 | 10/2009 | Maejima | |
| 2009/0278184 A1* | 11/2009 | Yaegashi | 257/314 |
| 2009/0321813 A1* | 12/2009 | Kidoh et al. | 257/324 |
| 2010/0105181 A1 | 4/2010 | Yun et al. | |
| 2010/0109065 A1 | 5/2010 | Oh et al. | |
| 2010/0159657 A1 | 6/2010 | Arai et al. | |
| 2010/0178755 A1 | 7/2010 | Lee et al. | |
| 2010/0181610 A1 | 7/2010 | Kim et al. | |
| 2010/0195395 A1 | 8/2010 | Jeong et al. | |
| 2010/0246257 A1 | 9/2010 | Ito et al. | |
| 2010/0254191 A1 | 10/2010 | Son et al. | |
| 2010/0327371 A1 | 12/2010 | Lee et al. | |
| 2011/0065270 A1 | 3/2011 | Shim et al. | |
| 2011/0092033 A1 | 4/2011 | Arai et al. | |
| 2011/0147824 A1 | 6/2011 | Son et al. | |
| 2011/0156132 A1 | 6/2011 | Kiyotoshi | |
| 2011/0291178 A1 | 12/2011 | Sasaki et al. | |
| 2011/0316069 A1 | 12/2011 | Tanaka et al. | |
| 2012/0001250 A1 | 1/2012 | Alsmeier | |
| 2012/0039130 A1 | 2/2012 | Yoon et al. | |
| 2012/0049148 A1 | 3/2012 | Fukano | |

FOREIGN PATENT DOCUMENTS

| | | |
|---|---|---|
| JP | 2001223284 A | 8/2001 |
| JP | 2005-268438 | 9/2005 |
| JP | 2007-180389 | 7/2007 |
| JP | 2007-317874 | 12/2007 |
| JP | 2008042209 A | 2/2008 |
| JP | 2008-072051 | 3/2008 |
| JP | 2008147664 A | 6/2008 |
| JP | 2008159669 A | 7/2008 |
| JP | 2008-192708 | 8/2008 |
| JP | 2008263029 A | 10/2008 |
| JP | 2009-016400 | 1/2009 |
| JP | 2009094236 A | 4/2009 |
| KR | 1020060089547 A | 8/2006 |
| KR | 10-2007-0008901 | 1/2007 |
| KR | 100707217 B1 | 4/2007 |
| KR | 1020070113535 A | 11/2007 |
| KR | 1020080070583 A | 7/2008 |
| KR | 1020090047614 A | 5/2009 |

OTHER PUBLICATIONS

Kim et al., "Future memory technology: challenges and opportunities," Symposium on VLSI-TSA Tech, 2008 IEEE, pp. 5-9.

Kim et al., "Novel Vertical-Stacked-Array-Transistor (VSAT) for ultra-high-density and cost-effective NAND Flash memory devices and SSD (Solid State Drive),".

Tanaka et al., "Bit Cost Scalable Technology with Punch and Plug Process for Ultra High Density Flash Memory," 2007 Symposium on VLSI Technology Digest of Technical Papers, pp. 14-15.

Program from the 6$^{th}$ Semiconductor Memory Symposium, Feb. 25, 2008, 11:10-12:00pm, "Multi-Cell NAND-Based SSD Technology and its Trend," Toshiba Semiconductor Company, Memory Business Department, Assistant to Department Manager Shinji Saito, 8 pages.

Koga et al., "Influences of Buried-Oxide Interface on Inversion-Layer Mobility in Ultra-Thin SOI MOSFETs," IEEE Transactions on Electron Devices, vol. 49, No. 6, Jun. 2002, pp. 1042-1048.

* cited by examiner

INTEGRATED CIRCUIT MEMORY DEVICES HAVING VERTICAL TRANSISTOR ARRAYS THEREIN AND METHODS OF FORMING SAME

REFERENCE TO PRIORITY APPLICATION

This application is a continuation of U.S. patent application Ser. No. 12/816,771, filed Jun. 16, 2010, which claims the benefit of U.S. Provisional Application No. 61/227,863, filed Jul. 23, 2009, and to Korean Application No. 10-2009-0121107, filed Dec. 8, 2009, the disclosures of which are hereby incorporated herein by reference in their entirety.

FIELD OF THE INVENTION

The present invention relates to integrated circuit devices and, more particularly, to integrated circuit memory devices and methods of forming same.

BACKGROUND

One class of nonvolatile memory devices includes electrically erasable programmable read only memory (EEPROM), which may be used in many applications including embedded applications and mass storage applications. In typical embedded applications, an EEPROM device may be used to provide code storage in personal computers or mobile phones, for example, where fast random access read times may be required. Typical mass storage applications include memory card applications requiring high capacity and low cost.

One category of EEPROM devices includes NAND-type flash memories, which can provide a low cost and high capacity alternative to other forms of nonvolatile memory. These NAND-type flash memories, which may include charge-trap type memory cells, may use vertical integration techniques to provide higher levels of integration and reduce power consumption requirements.

SUMMARY

Integrated circuit devices according to embodiments of the present invention include transistor arrays having a vertical stack of independently controllable gate electrodes therein. A first semiconductor channel region is provided, which extends on a first sidewall of the vertical stack of independently controllable gate electrodes. A first electrically insulating layer is also provided, which extends between the first semiconductor channel region and the first sidewall of the vertical stack of independently controllable gate electrodes. Source and drain regions are provided, which are electrically coupled to first and second ends of the first semiconductor channel region, respectively.

According to some of these embodiments of the present invention, the first electrically insulating layer may include a charge storage layer, which is sandwiched between a pair of electrically insulating layers. In addition, the gate electrodes in the vertical stack may be separated from each other by electrically insulating spacers. A second semiconductor channel region may also be provided, which extends on a second sidewall of the vertical stack of independently controllable gate electrodes. The second semiconductor channel region may have a first end electrically coupled to the source region and a second end electrically coupled to the drain region.

Additional embodiments of the present invention include integrated circuit memory devices having a vertical stack of independently controllable word lines therein that extend in parallel across a substrate. First and second charge storage layers are provided on opposite sidewalls of the vertical stack of independently controllable word lines and first and second semiconductor channel regions are provided on the first and second charge storage layers, respectively. A source region is provided, which is electrically coupled to first ends of the first and second semiconductor channel regions. A drain region is also provided, which is electrically coupled to second ends of the first and second semiconductor channel regions. According to some of these memory device embodiments, the first charge storage layer is sandwiched between a pair of electrically insulating layers that separate the first charge storage layer from the first semiconductor channel region and the vertical stack of independently controllable word lines.

According to additional embodiments of the invention, the substrate may be provided with a recess therein and a lowermost one of the vertical stack of independently controllable word lines may extend along a bottom and a sidewall of the recess. The sidewall of the recess may be a sloped sidewall that extends at a non-orthogonal angle relative to the bottom of the recess. The source region may also cover the bottom of the recess. The first and second charge storage layers may also extend within a U-shaped wrap-around charge storage layer having a connecting region therein that extends between the drain region and an uppermost one of the vertical stack of independently controllable word lines. Similarly, the first and second semiconductor channel regions and the drain region collectively define a U-shaped wrap-around semiconductor layer that extends on the U-shape wrap-around charge storage layer.

Additional embodiments of the present invention include methods of forming vertical transistor arrays by forming a recess in a semiconductor substrate and forming a source region of first conductivity type at a bottom of the recess. A vertical stack of independently controllable word lines is formed on the source region and is covered by a charge storage layer. This charge storage layer may be sandwiched between a pair of electrically insulating layers. The charge storage layer may also be covered with a semiconductor channel layer and a drain region of first conductivity type may be formed in the semiconductor channel layer. This step of covering the charge storage layer with a semiconductor channel layer may be followed by a step of selectively etching a portion of the semiconductor channel layer and a portion of the charge storage layer in sequence to expose sidewalls of the vertical stack of independently controllable word lines. The covering of the charge storage layer with a semiconductor channel layer may also be preceded by a step of selectively etching the charge storage layer to thereby expose portions of the source region of first conductivity type. The step of covering the charge storage layer with a semiconductor channel layer may include depositing the semiconductor channel layer onto and in contact with the exposed portions of the source region of first conductivity type.

Additional embodiments of the present invention include methods of forming a vertical transistor array by forming a recess in a semiconductor substrate and forming a source region of first conductivity type at a bottom of the recess. A vertical stack of word line layers is formed on the source region and on a sidewall of the recess. This vertical stack of word line layers is selectively etched to define a plurality of spaced-apart vertical stacks of word lines in the recess. The plurality of spaced-apart vertical stacks of word lines is covered with a charge storage layer. This charge storage layer may be selectively etched back to expose underlying portions of the source region, before depositing a semiconductor channel layer onto tops and sidewalls of the plurality of spaced-apart vertical stacks of word lines and onto the exposed underlying portions of the source region. The semiconductor channel layer may be selectively etched back to define a plurality of semiconductor channel layers at spaced locations on the plurality of spaced-apart vertical stacks. The step of selectively etching back the semiconductor channel layer may be preceded by a step of implanting drain region dopants into the semiconductor channel layer to thereby define a plurality of drain regions therein. The step of selectively etching back the semiconductor channel layer may also be preceded by a step of planarizing the semiconductor channel layer and the charge storage layer in sequence to expose ends of the plurality of spaced-apart vertical stacks of word lines that extend adjacent the sidewall of the recess. A plurality of bit lines may also be formed, which are electrically coupled to the plurality of drain regions.

Additional methods of forming a non-volatile memory device may also include forming a recess in a semiconductor substrate and forming a vertical stack of word line layers on a bottom and a sidewall of the recess. The vertical stack of word line layers is then selectively etched to define a plurality of spaced-apart vertical stacks of word lines in the recess. A charge storage layer is deposited onto sidewalls of the plurality of spaced-apart vertical stacks of word lines and a semiconductor channel layer is deposited onto tops and sidewalls of the plurality of spaced-apart vertical stacks of word lines. The semiconductor channel layer is selectively etched back to define a plurality of semiconductor channel layers at spaced locations on the plurality of spaced-apart vertical stacks. These methods may also include planarizing the semiconductor channel layer and the charge storage layer in sequence to expose ends of the word lines in the plurality of spaced-apart vertical stacks of word lines. The step of forming a vertical stack of word line layers on a bottom and a sidewall of the recess may also be preceded by forming a source region of first conductivity type along a bottom and sidewall of the recess. The step of depositing a charge storage layer may include depositing a charge storage layer onto the bottom of the recess. In addition, the step of depositing a semiconductor channel layer may be preceded by selectively removing a portion of the charge storage layer from the bottom of the recess.

Memory devices according to additional embodiments of the invention include a vertical stack of independently controllable word lines that extend parallel to each other across a substrate. First and second charge storage layers are provided on opposite sidewalls of the vertical stack of independently controllable word lines, and first and second semiconductor channel regions are provided on the first and second charge storage layers, respectively. In addition, first and second metal source electrodes are provided on first ends of the first and second semiconductor channel regions, respectively, and a drain region is provided, which is electrically coupled to second ends of the first and second semiconductor channel regions. According to additional aspects of these embodiments, the substrate may have a recess therein and the vertical stack of independently controllable word lines may be disposed within the recess. In addition, the first and second semiconductor channel regions may contact a bottom of the recess and the first semiconductor channel region may extend between the first metal source electrode and the bottom of the recess.

According to still further embodiments of the invention, a non-volatile memory device is provided that includes a NAND-type string of non-volatile memory cells therein. This NAND-type string includes at least a first vertically-stacked array of charge trap memory cells on a semiconductor substrate, a string select transistor on a first side of the first vertically-stacked array of charge trap memory cells and a ground select transistor on a second side of the first vertically-stacked array of charge trap memory cells. The first vertically-stacked array of charge trap memory cells includes a semiconductor layer covering first and second opposing sidewalls thereof. This semiconductor layer is electrically connected to a first source/drain terminal of the string select transistor and a first source/drain terminal of the ground select transistor. The semiconductor substrate also includes an electrically insulating layer therein and the first vertically-stacked array of charge trap memory cells is disposed on the electrically insulating layer. The NAND-type string of non-volatile memory cells also includes a second vertically-stacked array of charge trap memory cells on the electrically insulating layer. The semiconductor layer may also cover first and second opposing sidewalls of the second vertically-stacked array of charge trap memory cells. According to additional aspects of these embodiments of the invention, a bit line is provided, which is electrically coupled to a second source/drain terminal of the string select transistor, and a ground select line is provided, which is electrically coupled to a second source/drain terminal of the ground select transistor.

Non-volatile memory devices according to still further embodiments of the invention include a NAND-type string of non-volatile memory cells. This NAND-type string includes at least a first vertically-stacked array of charge trap memory cells on a semiconductor substrate, a vertically-stacked array of string select transistors on a first side of the first vertically-stacked array of charge trap memory cells and a vertically-stacked array of ground select transistors on a second side of the first vertically-stacked array of charge trap memory cells. The NAND-type string of non-volatile memory cells includes a semiconductor layer covering first and second opposing sidewalls of the first vertically-stacked array of charge trap memory cells, at least a first sidewall of the vertically-stacked array of string select transistors and at least a first sidewall of the vertically-stacked array of ground select transistors. This non-volatile memory device also includes a common source line, which contacts a portion of the semiconductor layer extending on the vertically-stacked array of ground select transistors, and a bit line, which contacts a portion of the semiconductor layer extending on the vertically-stacked array of string select transistors.

DETAILED DESCRIPTION OF PREFERRED EMBODIMENTS

Figure 1A:
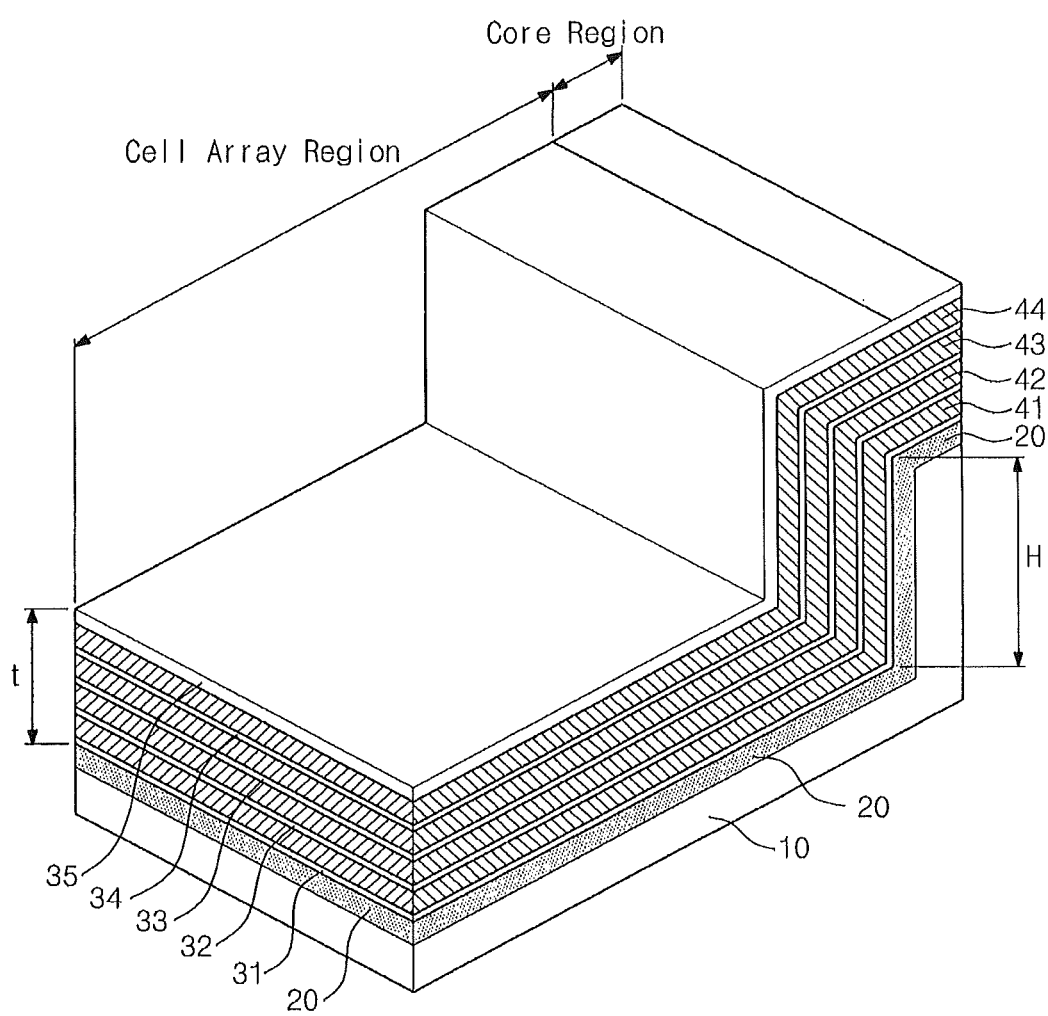
FIGS. 1A-1F are three-dimensional perspective views of intermediate structures that illustrate methods of forming an integrated circuit memory device, according to embodiments of the present invention.

The present invention now will be described more fully herein with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout and signal lines and signals thereon may be referred to by the same reference characters.

Figure 1B:
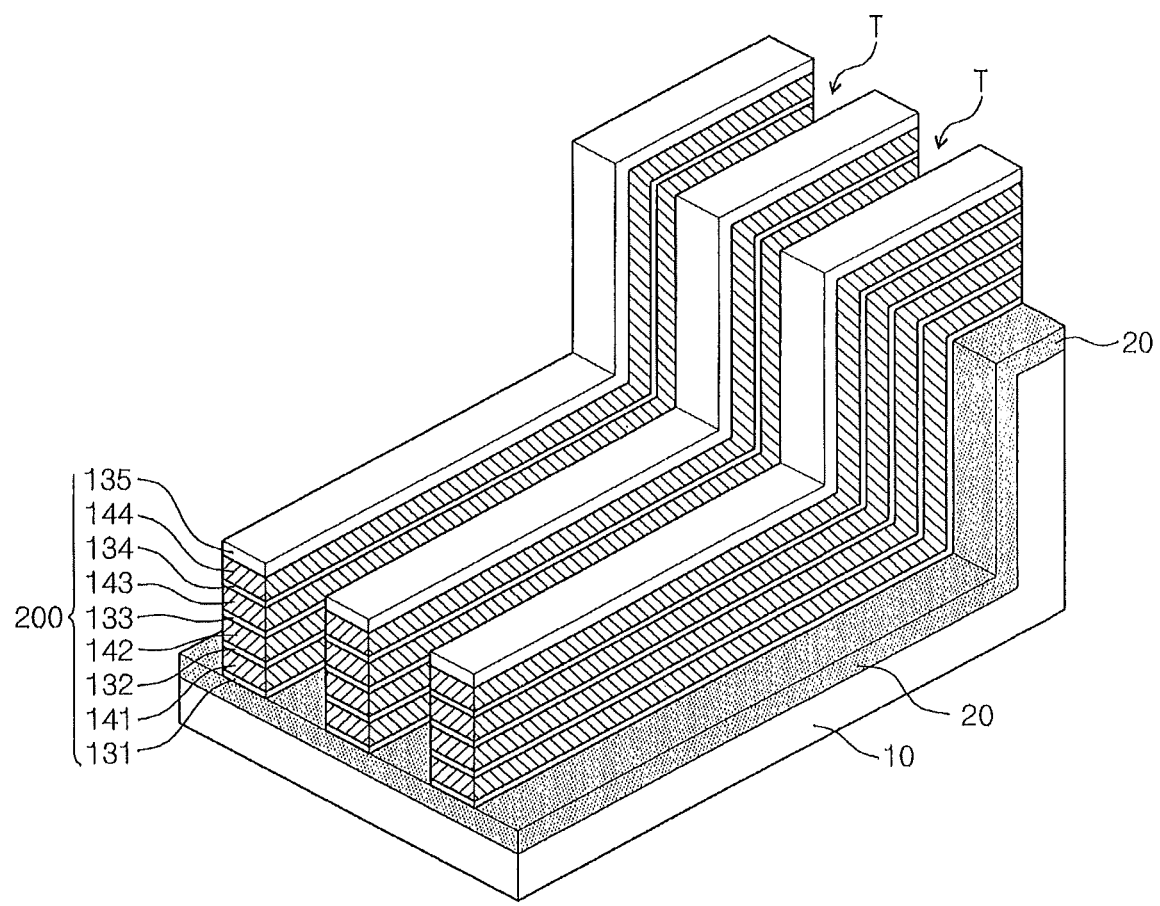

Methods of forming integrated circuit memory devices according to embodiments of the present invention are illustrated by FIGS. 1A-1F. In particular, FIGS. 1A-1B illustrate steps to define a plurality of spaced-apart vertical stacks of electrically conductive lines in a recess in a semiconductor substrate 10. As shown by FIG. 1A, a relatively large area recess/trench is formed in a memory cell array region of a semiconductor substrate 10 (e.g., P-type semiconductor substrate). This recess is illustrated as having a height "H". The steps of forming the recess are followed by a step to selectively implant source region dopants (e.g., N-type dopants) into a bottom of the recess and then drive-in the implanted source region dopants to define a relatively large area source region 20 covering a bottom of the recess. In order to provide efficient electrical connections to the source region 20, the source region dopants can be implanted into a sidewall of the recess and an upper surface of the substrate 10. However, according to alternative embodiments of the invention, the source region dopants may be selectively implanted into the bottom of the recess, but masked from the upper surface of the substrate 10. In these embodiments, separate electrical contact (not shown) may be provided to the source region 20 within the recess in order to prevent the source region 20 from electrically floating.

A first electrically insulating layer 31 (e.g., silicon dioxide layer) is then conformally deposited on the bottom and sidewalls of the recess. As shown by FIG. 1A, the first electrically insulating layer 31 may also be formed on an upper surface of the substrate 10 and may even extend into a core logic portion ("core region") therein. This first electrically insulating layer 31 may be formed to have a thickness in a range from about 20Å to about 2000Å.

An alternating sequence of electrically conductive layers 41-44 and electrically insulating layers 32-35 is then formed on the first electrically insulating layer 31, as illustrated. This alternating sequence layers may have a combined thickness "t", which is less than the height "H" of the recess. The electrically conductive layers 41-44 may be formed as doped polysilicon layers having thicknesses in a range from about 50Å to about 1000Å. Thereafter, as illustrated by FIG. 1B, a photolithographically defined selective etching step can be performed to etch through the stacked conductive and insulating layers 31-35 and 41-44 and thereby define a plurality of spaced-apart vertical stacks 200 of electrically conductive lines that are separated by respective trenches "T", and expose corresponding portions of the source region 20 within the recess. As further illustrated by FIG. 1B, each spaced-apart vertical stack 200 of electrically conductive lines, which are described hereinbelow as local word lines of a non-volatile memory device, includes an alternating arrangement of patterned electrically insulating spacer layers 131-135 and patterned electrically conductive lines 141-144.

Figure 1C:
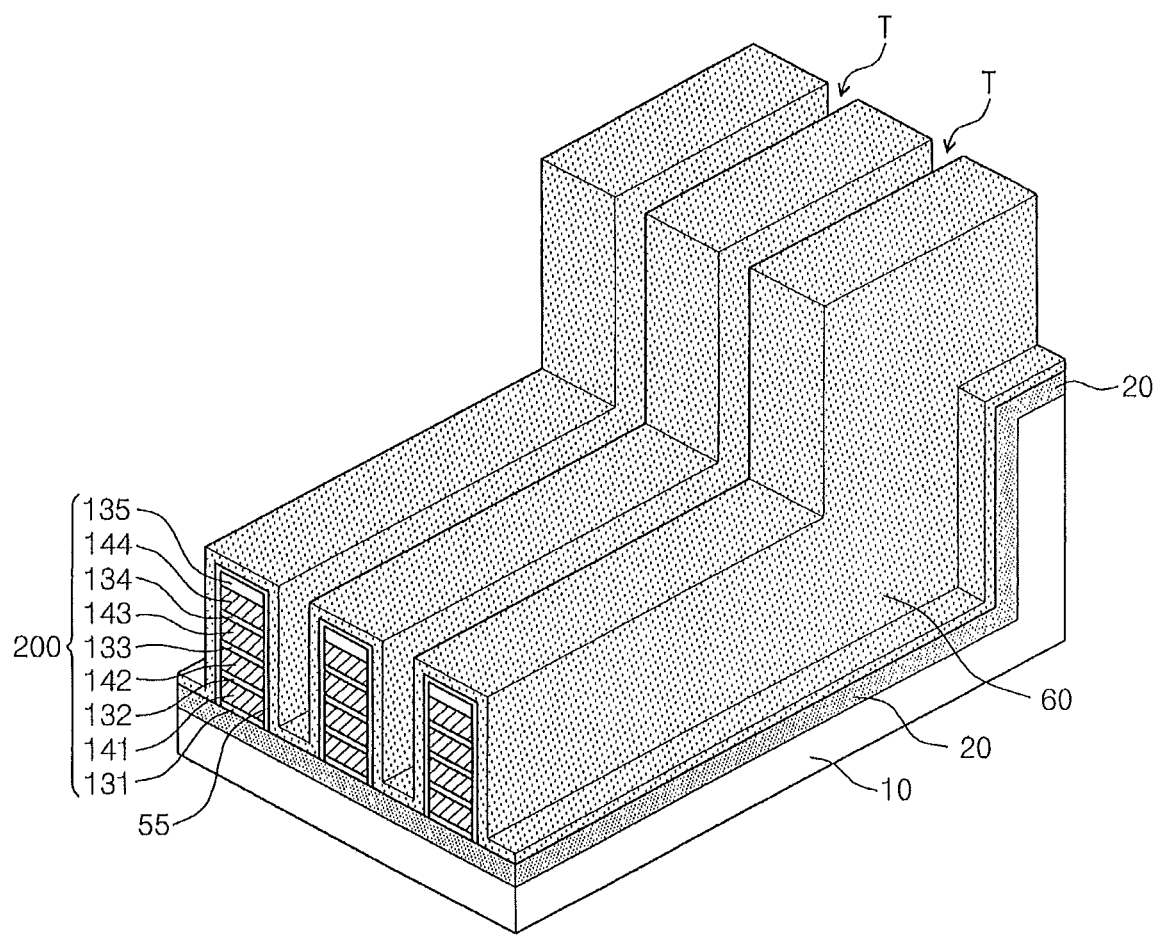

Referring now to FIG. 1C, a data storage layer 55 is formed on the exposed sidewalls and upper surfaces of each of the vertical stacks 200 of electrically conductive lines. As described more fully hereinbelow, each data storage layer 55 may include a plurality of layers, such as a tunneling layer, a charge storage layer and a blocking layer. The data storage layers 55 may be formed by depositing a plurality of layers on the vertical stacks 200 of FIG. 1B and then selectively etching back portions of the deposited layers to thereby expose underlying portions of the source region 20. The formation of the data storage layers 55 is followed by a step of conformally depositing a semiconductor layer 60 (e.g., poly-crystalline silicon layer, single crystal silicon layer) on the vertical stacks 200 and directly on the exposed portions of the source region 20, as illustrated. In some embodiments of the present invention, this semiconductor layer 60 may be doped by implanting dopants (e.g., N-type drain region dopants) into horizontal portions of the semiconductor layer 60.

Figure 1D:
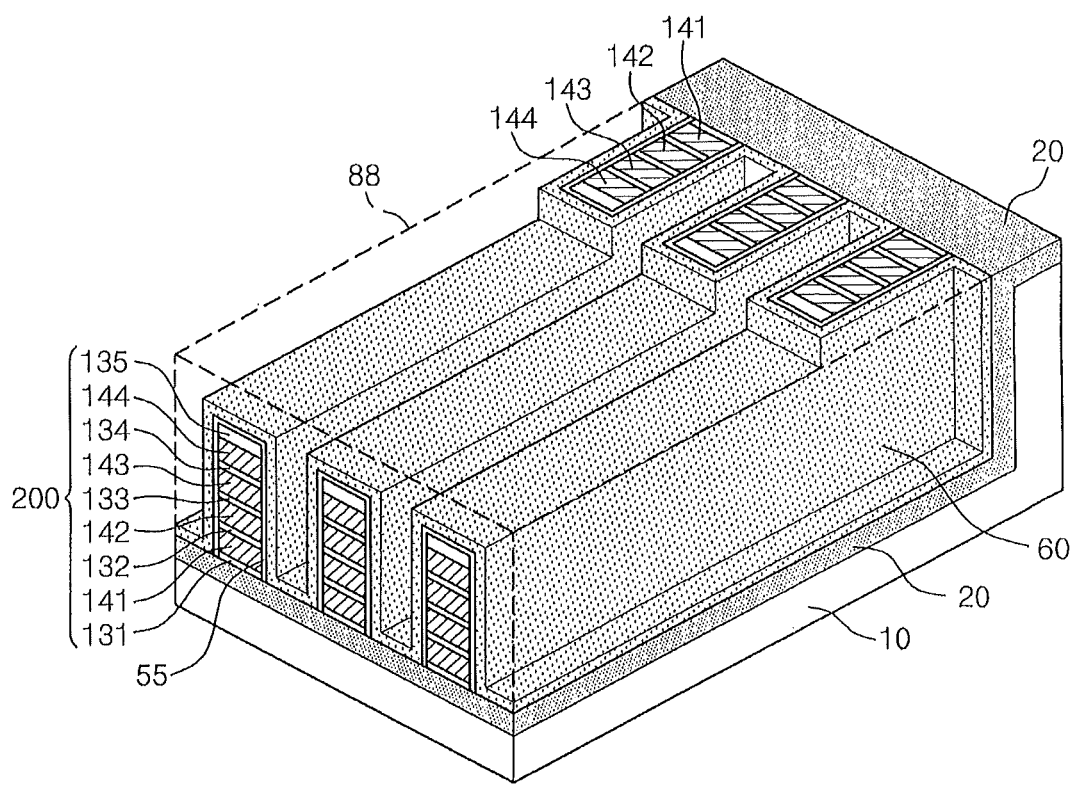

Referring now to FIG. 1D, an electrically insulating dielectric layer 88 may then be deposited to cover portions of the semiconductor layer 60 within the recess. Thereafter, a planarization step may be performed to expose vertically extending portions of the electrically conductive lines 141-144, which extend upward along a sidewall of the recess. This planarization step may be performed using an upper surface of the semiconductor substrate 10 as a planarization stop.

Figure 1E:
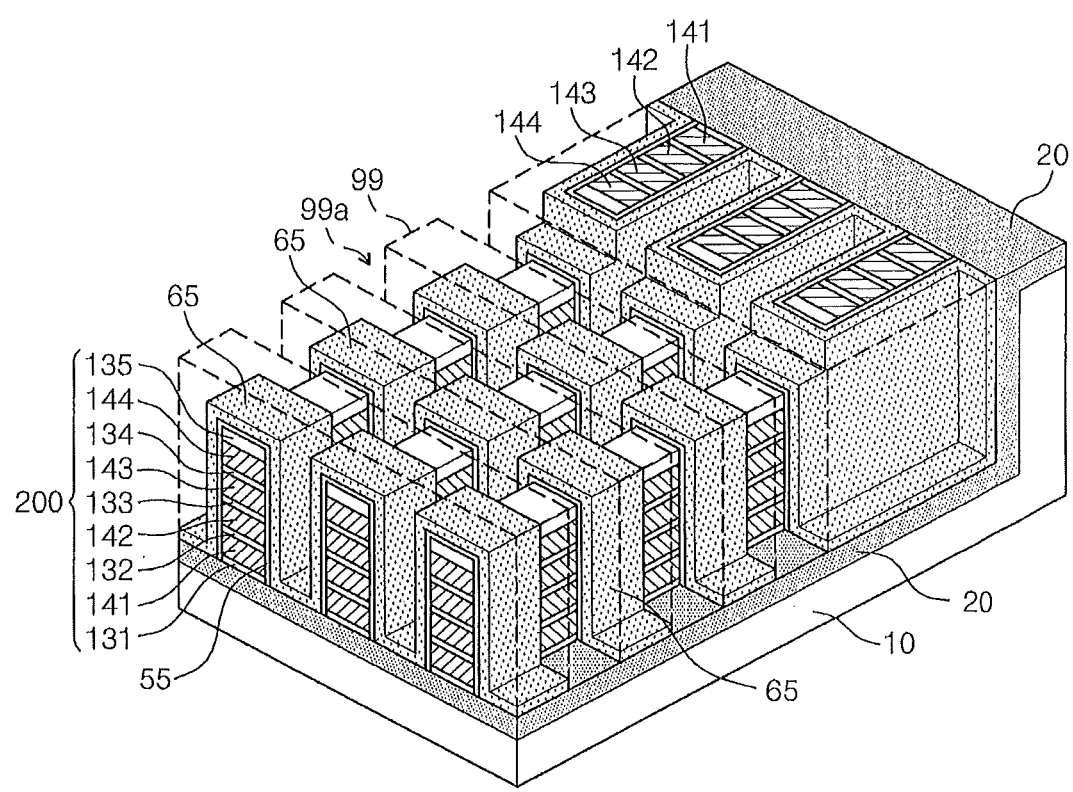
Figure 1F:
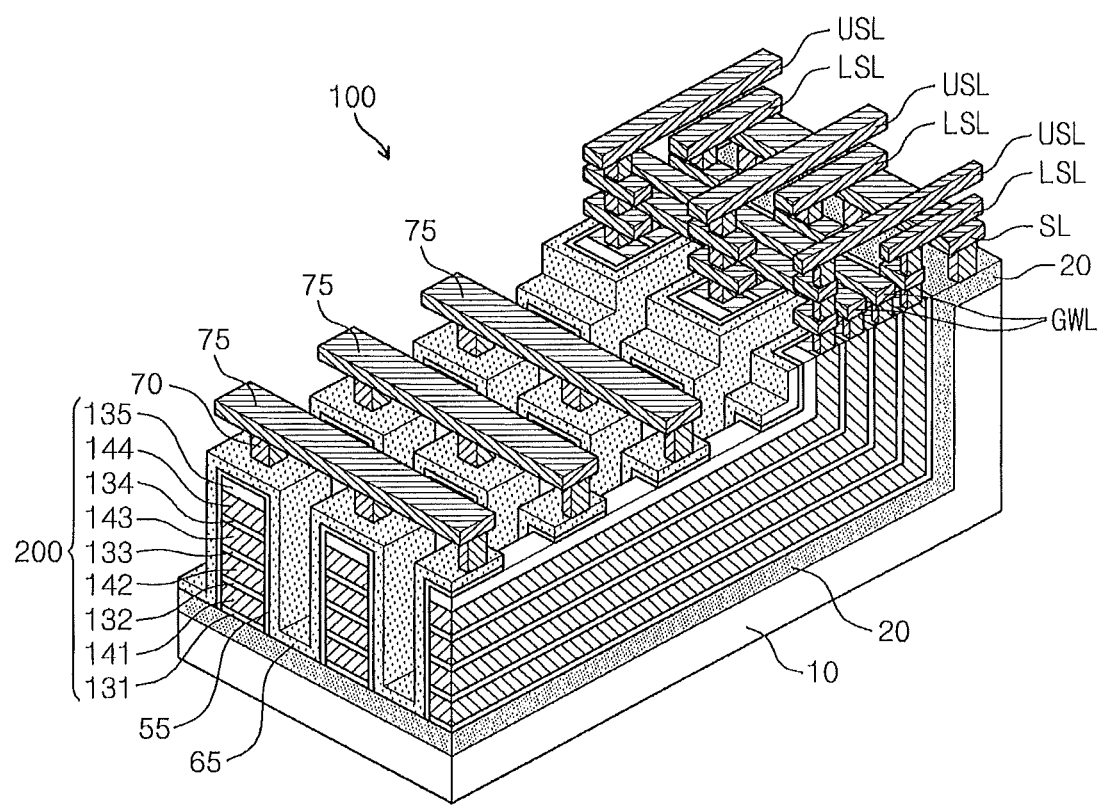

As shown by FIG. 1E, the dielectric layer 88 of FIG. 1D may be patterned to define a plurality of stripe-shaped openings 99a therein, which extend between the remaining dielectric patterns 99. These dielectric patterns 99 are then used as etching masks during a step to sequentially etch through the semiconductor layer 60 and the data storage layers 55 and thereby expose portions of the spaced-apart vertical stacks 200 and the source region 20. During this sequential etching step, the semiconductor layer 60 is patterned into a plurality of semiconductor patterns 65 that extend in parallel with each other and the data storage layers are further patterned into a plurality of U-shaped wrap-around charge storage layers 55. Referring now to FIG. 1F, the dielectric patterns 99 of FIG. 1E may be selectively patterned to define drain region contact holes therein that are then filled with electrically conductive plugs 70. Thereafter, photolithographically defined metallization steps may be performed to define a plurality of bit lines 75 that extend on and contact the electrically conductive plugs 70. Conventional metal interconnect and patterning techniques may also be performed to define: (i) a plurality of global word lines GWL that respectively connect a plurality of local word lines together; (ii) an upper select line USL (for an upper string select transistor) connected to an uppermost local word line; (iii) a lower select line LSL (for a lower ground select transistor) connected to a lowermost local word line; and (iv) a common source line SL, as illustrated. Alternatively, as illustrated by the memory device 300 of FIG. 3, the common source region 20 of FIG. 1F may be formed as a plurality of spaced-apart source lines 20' by selectively implanting source region dopants into the recess in the substrate 10 using a photolithographically defined mask (not shown) as an implant mask.

Figure 1G:
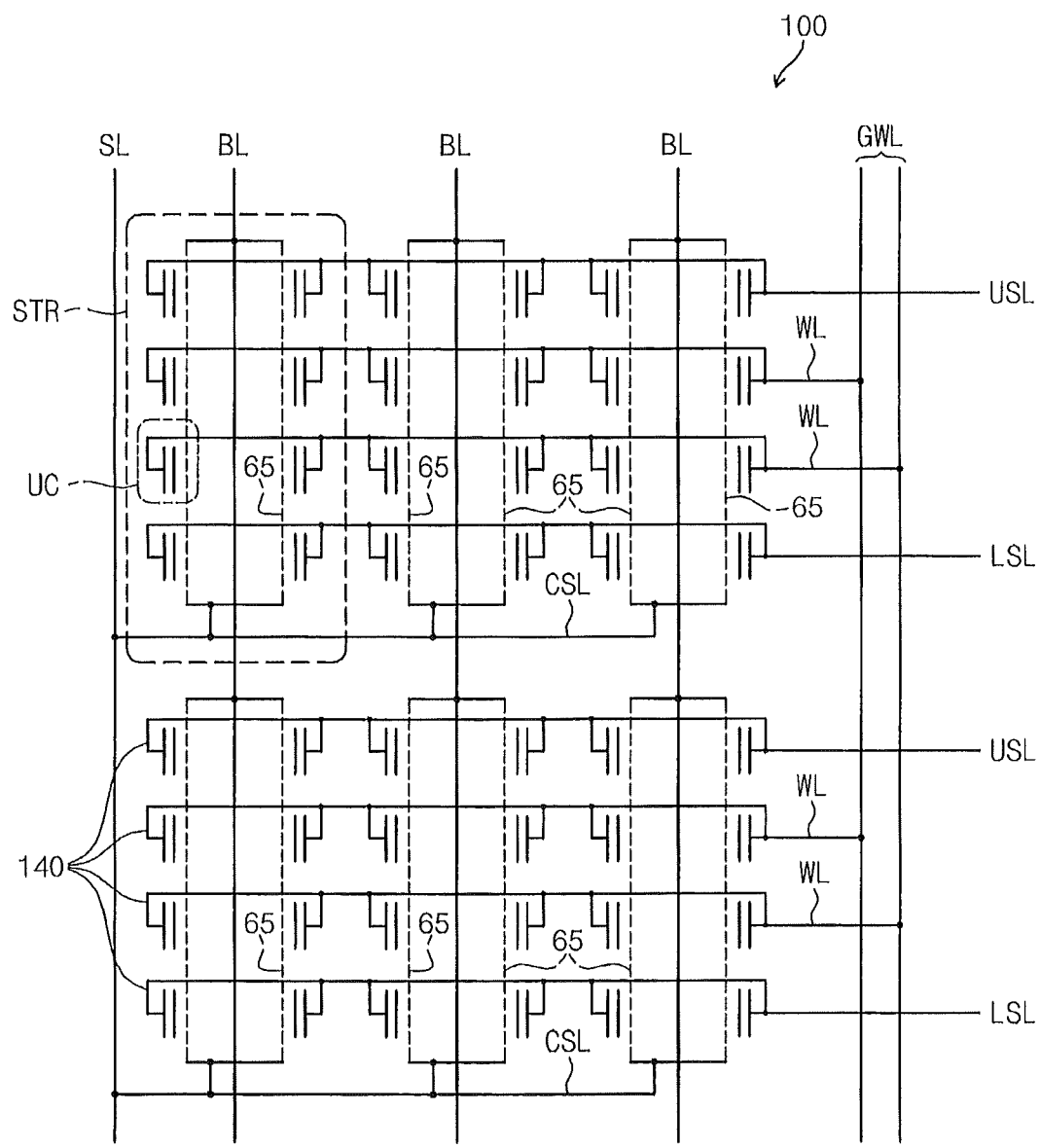
FIG. 1G is an electrical schematic of the integrated circuit memory device of FIG. 1F.
Figure 1H:
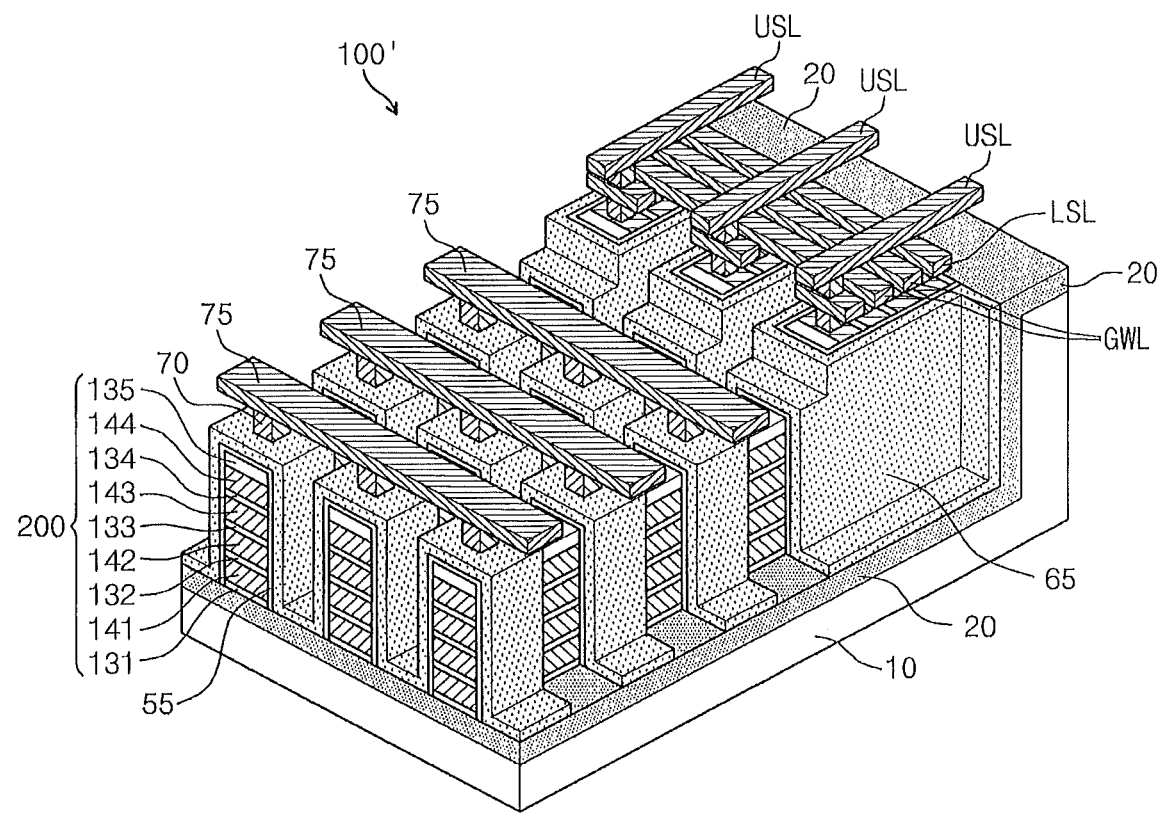
FIG. 1H is a perspective view of an alternative embodiment of the memory device illustrated by FIG. 1F.
Figure 1I:
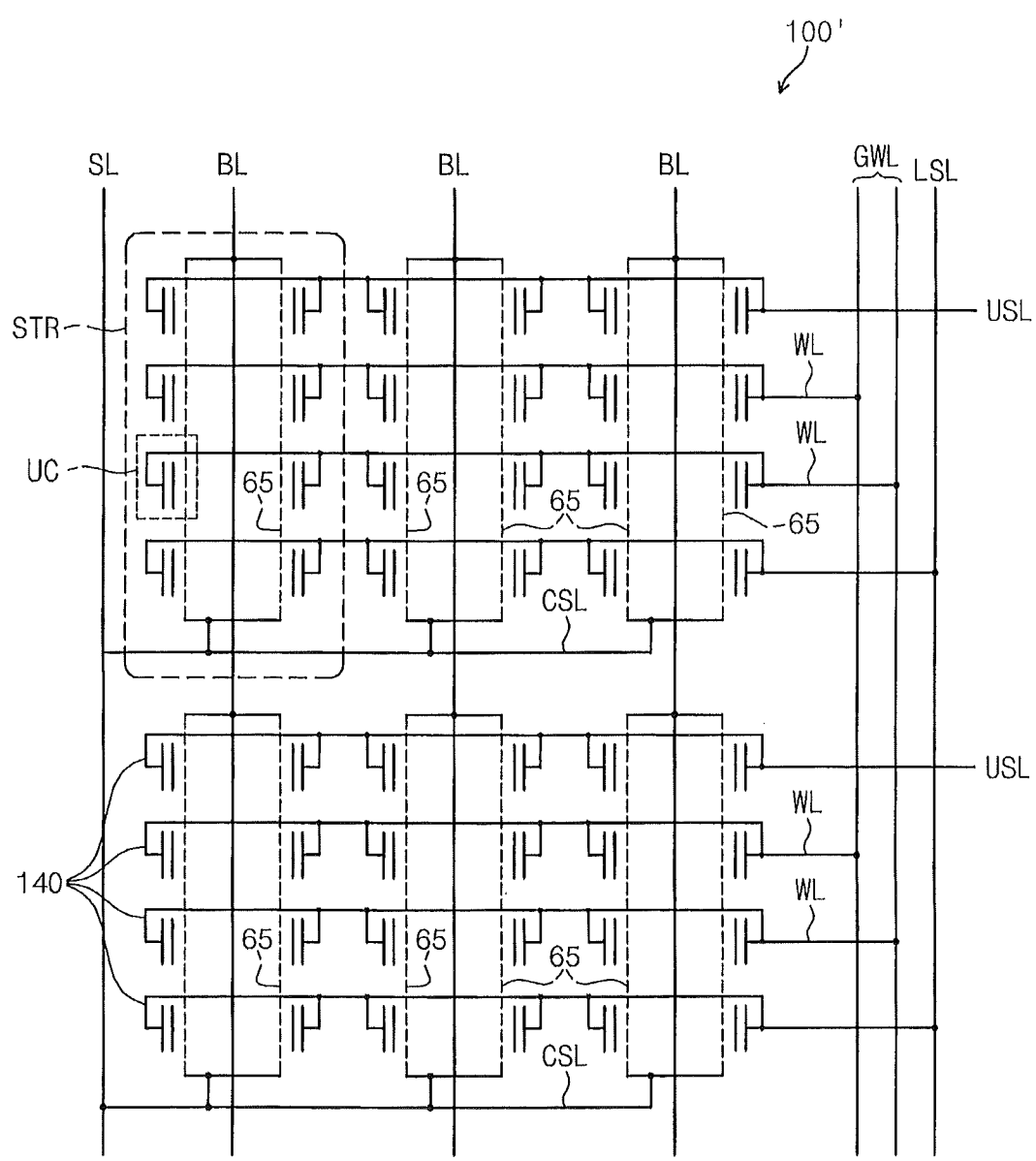
FIG. 1I is an electrical schematic of the integrated circuit memory device of FIG. 1H.

This memory device 100 of FIG. 1F is further illustrated by the electrical schematic of FIG. 1G. As illustrated by FIG. 1G, each non-volatile memory cell (unit cell (UC)) has a control gate electrode electrically coupled to a local word line (WL), which is connected to a corresponding global word line (GWL). Each string of memory cells (STR) is electrically coupled to a respective bit line (BL). Each of these strings includes an upper string select transistor having a gate electrode connected to an upper string select line (USL) and a lower string select transistor having a gate electrode connected to a lower string select line (LSL). These lower string select transistors have source regions that are commonly connected within a source region 20, which is electrically coupled to the common source line SL. The dotted lines identified by reference numeral 65 reflect each of the vertical semiconductor patterns 65 illustrated by FIG. 1F. The reference numeral 140 identifies the word line segments associated with each string of memory cells associated with the electrically conductive lines 141-144 illustrated by FIG. 1F. In contrast to the embodiments illustrated hereinabove by FIGS. 1F and 1G, a memory device 100' according to alternative embodiments of the present invention utilizes a lower string select line (LSL) that is common to multiple strings of memory cells and extends in parallel with the global word lines (GWL), as illustrated by FIGS. 1H-1I.

Figure 2A:
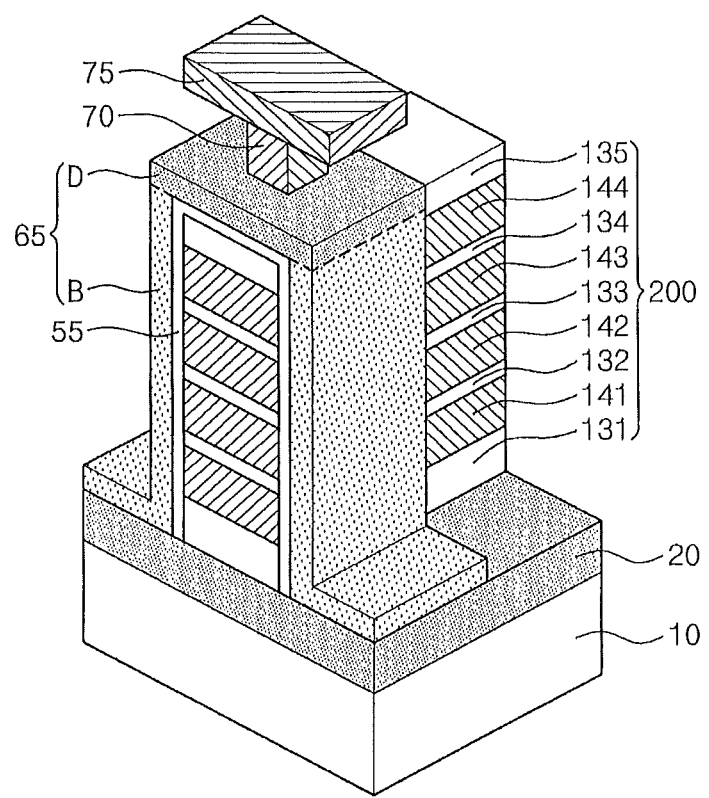
FIG. 2A is a perspective view of a unit cell of the integrated circuit memory device of FIG. 1F.
Figure 2B:
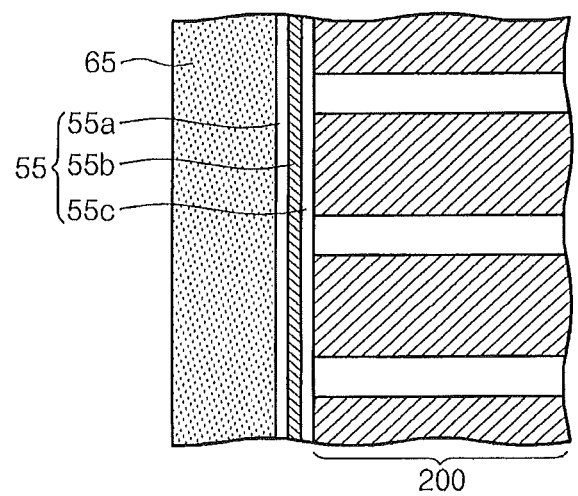
FIG. 2B is a cross-sectional view of a portion of the unit cell of FIG. 2A.

FIGS. 2A-2B highlight some aspects of the regions, layers and features illustrated by FIGS. 1A-1F in greater detail. In particular, FIG. 2A is an enlarged perspective view of a portion of a vertical stack illustrated by FIG. 1F. In this perspective view of FIG. 2A, the reference character "D" represents a drain region (e.g., N+ drain region) that is electrically connected to a respective bit line 75 by an electrically conductive plug 70. The reference character "B" represents a body region (e.g., channel region) within a semiconductor pattern 65. This semiconductor pattern 65 is separated from the electrically conductive lines 141-144 by a data storage layer 55. As highlighted by FIG. 2B, which represents an enlarged cross-sectional view of a highlighted portion of the device illustrated by FIG. 2A, the data storage layer 55 can include a plurality of layers, such as a tunneling layer 55a (e.g., tunnel oxide layer), a charge storage layer 55b (e.g., charge trapping layer) and a blocking layer 55c (e.g., electrically insulating layer). This combination of layers may be used within a charge-trap type non-volatile memory device. Other combinations of layers may also be provided according to other embodiments of the invention.

Figure 4:
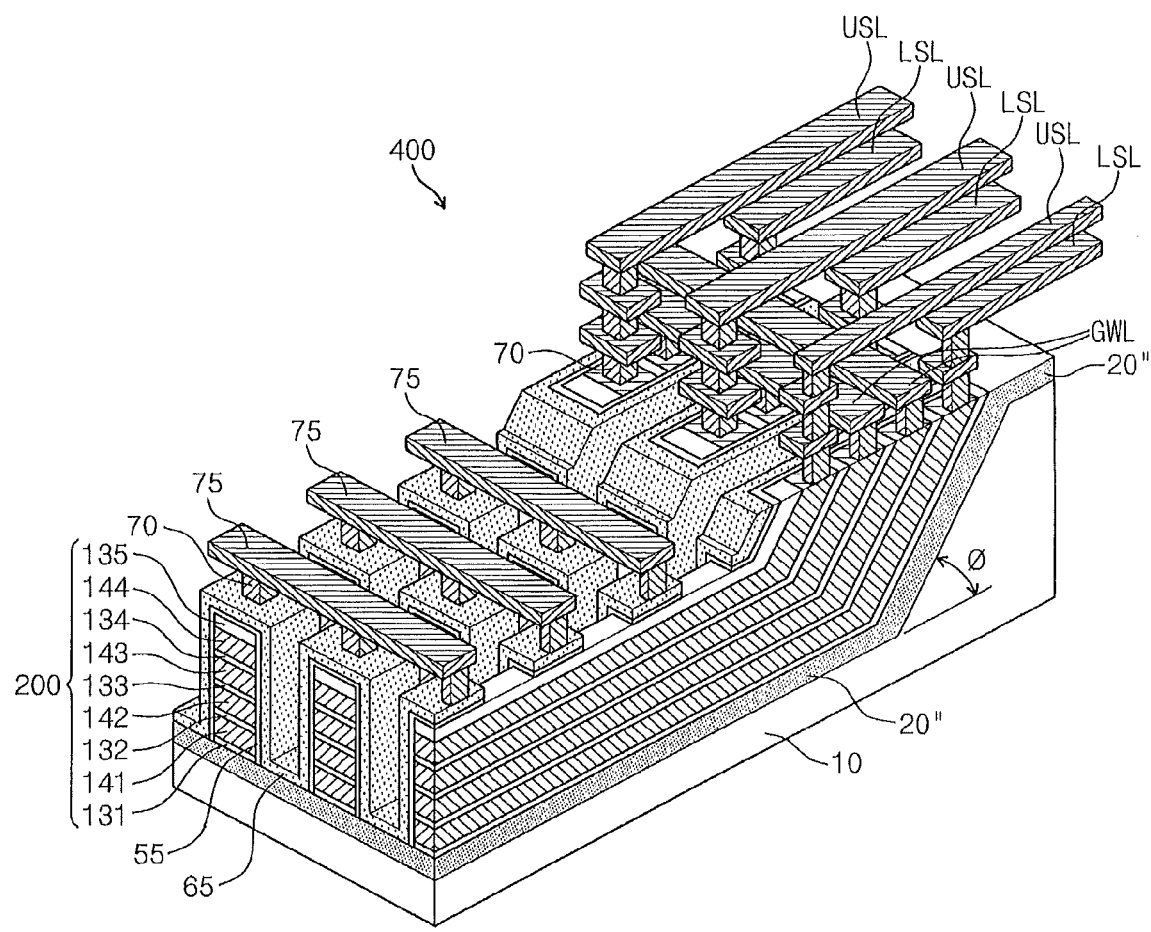
FIG. 4 is a perspective view of an integrated circuit memory device according to another embodiment of the present invention.

FIG. 4 illustrates a perspective view of an integrated circuit memory device 400 according to another embodiment of the invention. This memory device 400 is similar to the memory device 100 of FIG. 1F, however, a sidewall of the recess in the substrate 10 is sloped at an angle of θ. Based on this configuration of the recess, the source region 20'' extends along the sloped sidewall of the recess, as illustrated. Moreover, the sloped nature of the sidewall can advantageously yield an increase in contact area between the plurality of word lines 141-144 and the illustrated select and word lines (USL, LSL, GWL), as illustrated.

Figure 5A:
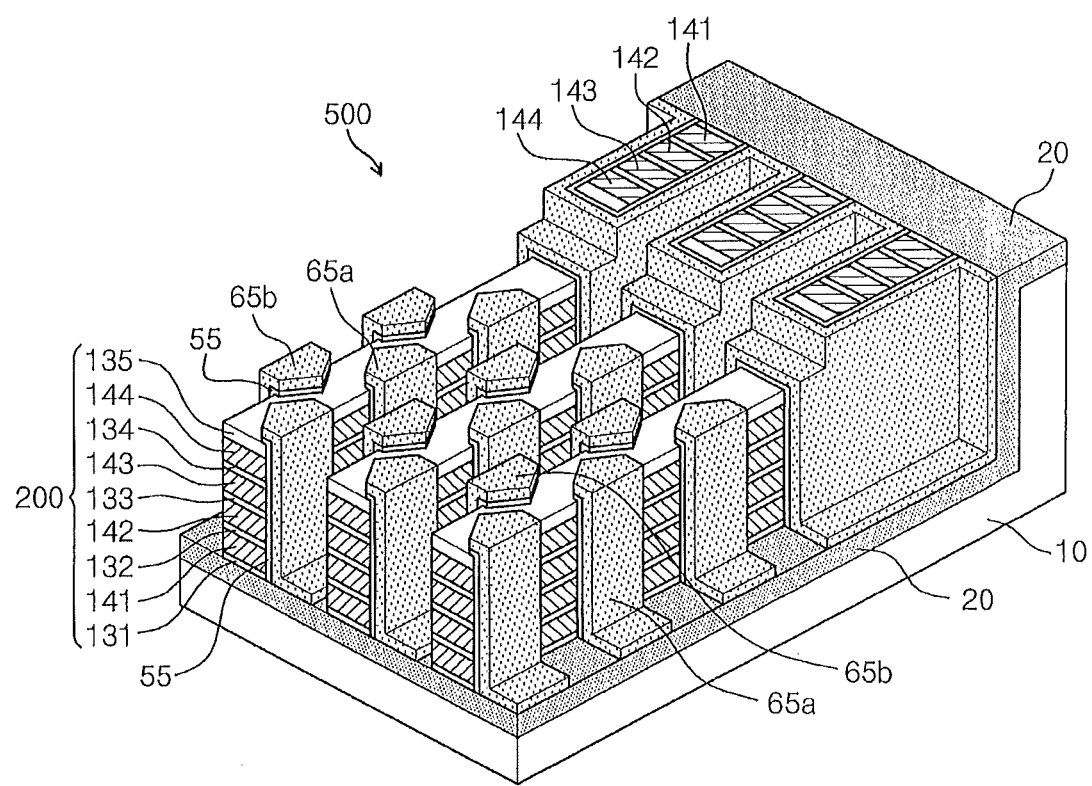
FIG. 5A is a perspective view of an integrated circuit memory device according to another embodiment of the present invention.
Figure 5B:
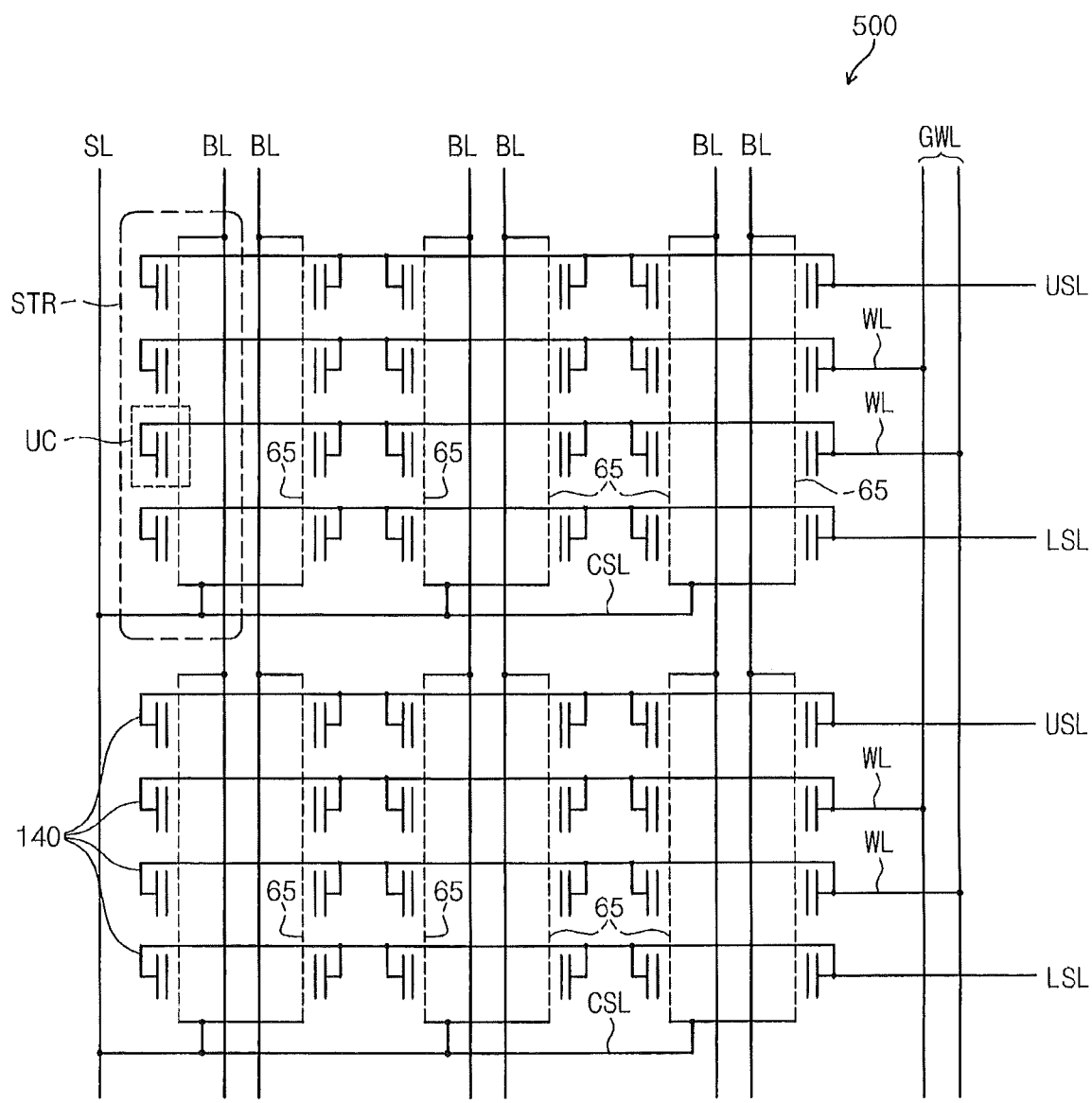
FIG. 5B is an electrical schematic of the integrated circuit memory device of FIG. 5A.

FIG. 5A is a perspective view of an integrated circuit memory device 500 according to another embodiment of the present invention and FIG. 5B is an electrical schematic of the memory device 500 of FIG. 5A after formation of the electrical conductive plugs, interconnects and lines (e.g., USL, LSL, SL, GWL, BL) of FIG. 1F have been added. This memory device 500 of FIG. 5A is similar to the memory device of FIG. 1E, however, the striped-shaped semiconductor patterns 65 of FIG. 1E, which extend as continuous stripe-shaped regions, are segmented into separate semiconductor patterns 65a, 65b. Based on these separate semiconductor patterns 65a, 65b, the number of bit lines that can be supported by the memory device 500 can be increased (e.g., doubled), as illustrated by FIG. 5B.

Figure 3:
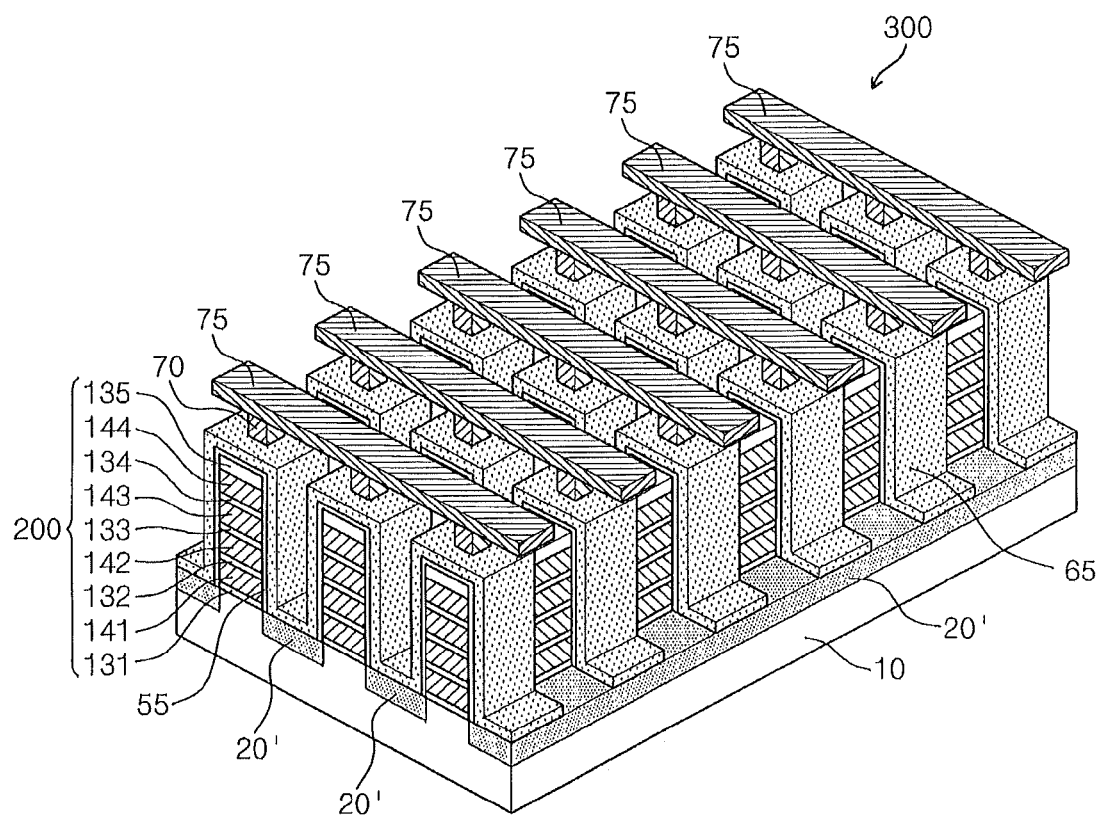
FIG. 3 is a perspective view of an integrated circuit memory device according to another embodiment of the present invention.
Figure 6A:
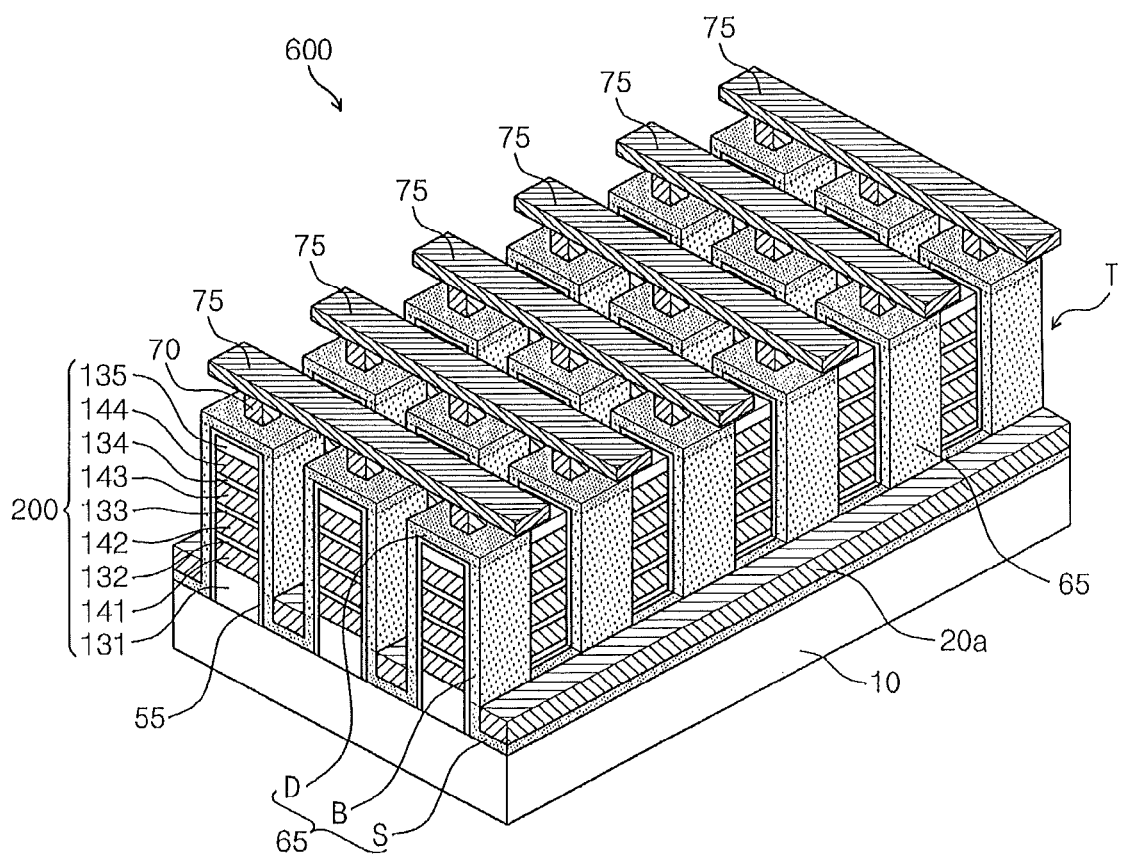
FIG. 6A is a perspective view of an integrated circuit memory device according to another embodiment of the present invention.
Figure 6B:
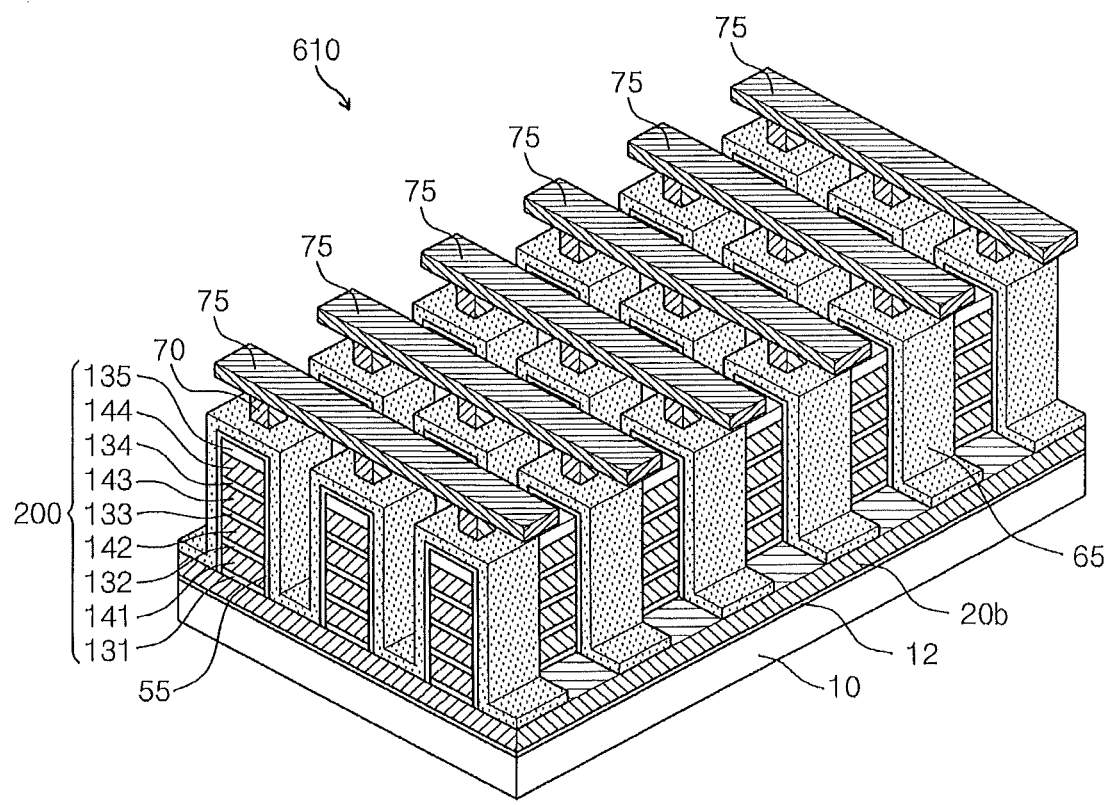
FIG. 6B is a perspective view of an integrated circuit memory device according to another embodiment of the present invention.

FIG. 6A illustrates a perspective view of a memory device 600 according to another embodiment of the present invention. This memory device 600 is similar to the memory device 300 of FIG. 3, however, the source lines 20' of FIG. 3 are replaced by striped-shaped electrically conductive source lines 20a (e.g., metal source lines) that extend on upper surfaces of the semiconductor patterns 65. In FIG. 6B, a memory device 610 is illustrated with a large area source line 20b (e.g., metal layer) that is separated from an underlying substrate 10 by an electrically insulating layer 12 (e.g., silicon dioxide layer). In addition, the semiconductor patterns 65 are provided on an upper surface of the source line 20b, as illustrated.

Figure 7A:
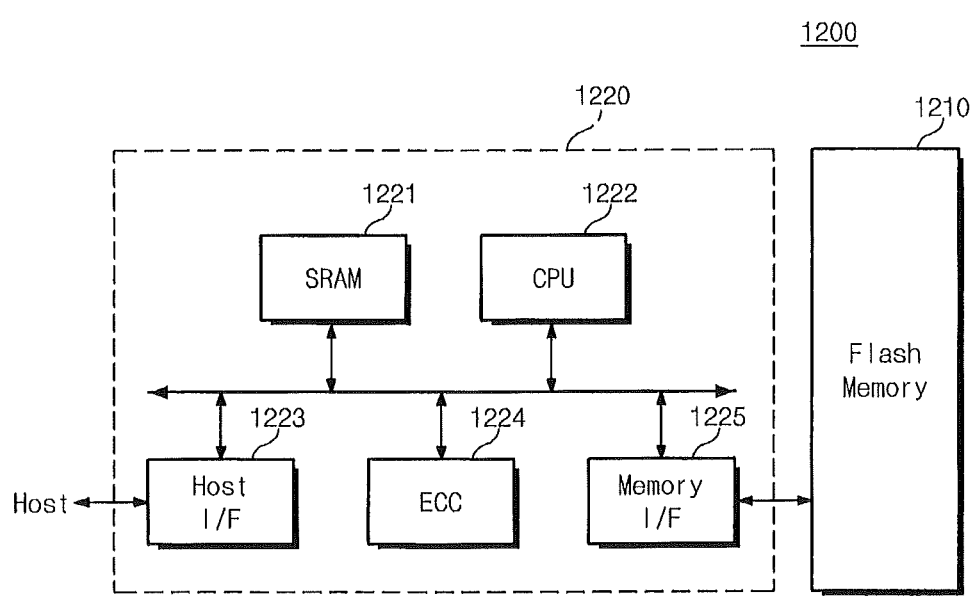
FIG. 7A is a block diagram of an integrated circuit non-volatile memory system according to an embodiment of the present invention.

FIG. 7A is a block diagram of a memory system 1200 that may include a nonvolatile memory device according to embodiments of the present invention. This system 1200 is illustrated as including a flash memory device 1210, such as the memory devices of FIGS. 1F-1G and 3-4, 5A-5B and 6A-6B. This flash memory device 1210 is illustrated as communicating with an external memory interface system 1220. The interface system 1220 is illustrated as including a memory interface circuit 1225, which is electrically coupled to a central bus. Other components connected to this central bus include a central processing unit 1222, a volatile memory device 1221 (e.g., SRAM), an error correction circuit 1224 (ECC) and a host interface circuit 1223.

Figure 7B:
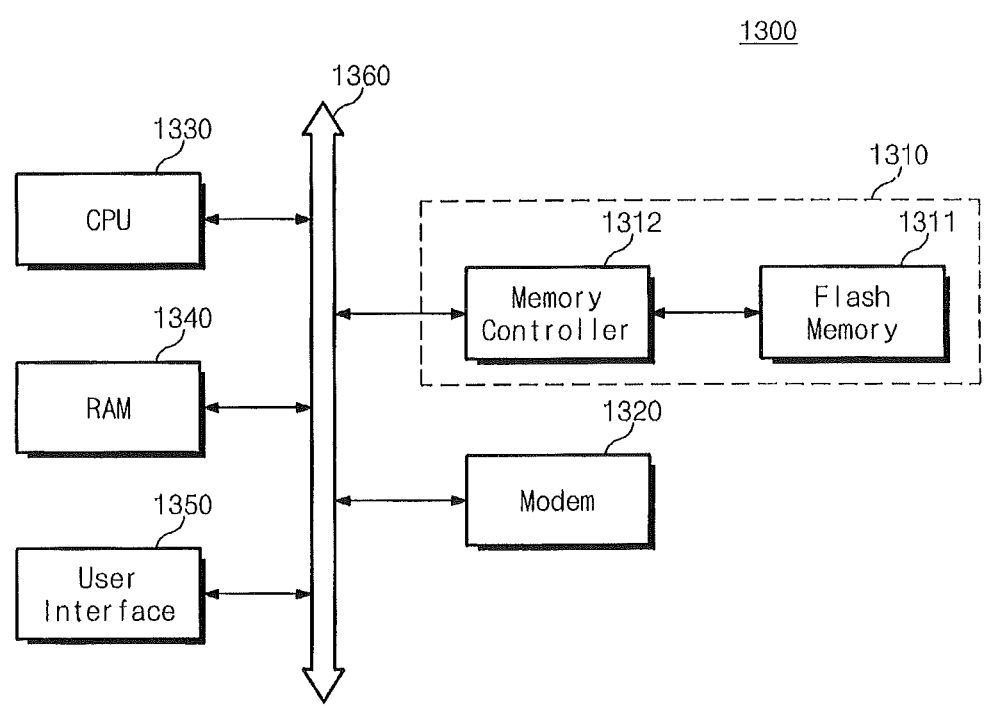
FIG. 7B is a block diagram of an integrated circuit non-volatile memory system according to an embodiment of the present invention.

FIG. 7B is a block diagram of an integrated circuit device 1300 according to embodiments of the present invention. This device includes a nonvolatile memory system 1310, which includes a memory controller 1312 and a flash memory device 1311. This flash memory device 1311 may be configured as illustrated by the memory devices of FIGS. 1F-1G and 3-4, 5A-5B and 6A-6B. Other components of the device 1300 include a central processing unit 1330, a volatile memory 1340 (e.g., RAM), a user interface 1350 and a modem 1320, which communicate via a data/command bus 1360.

Figure 8A:
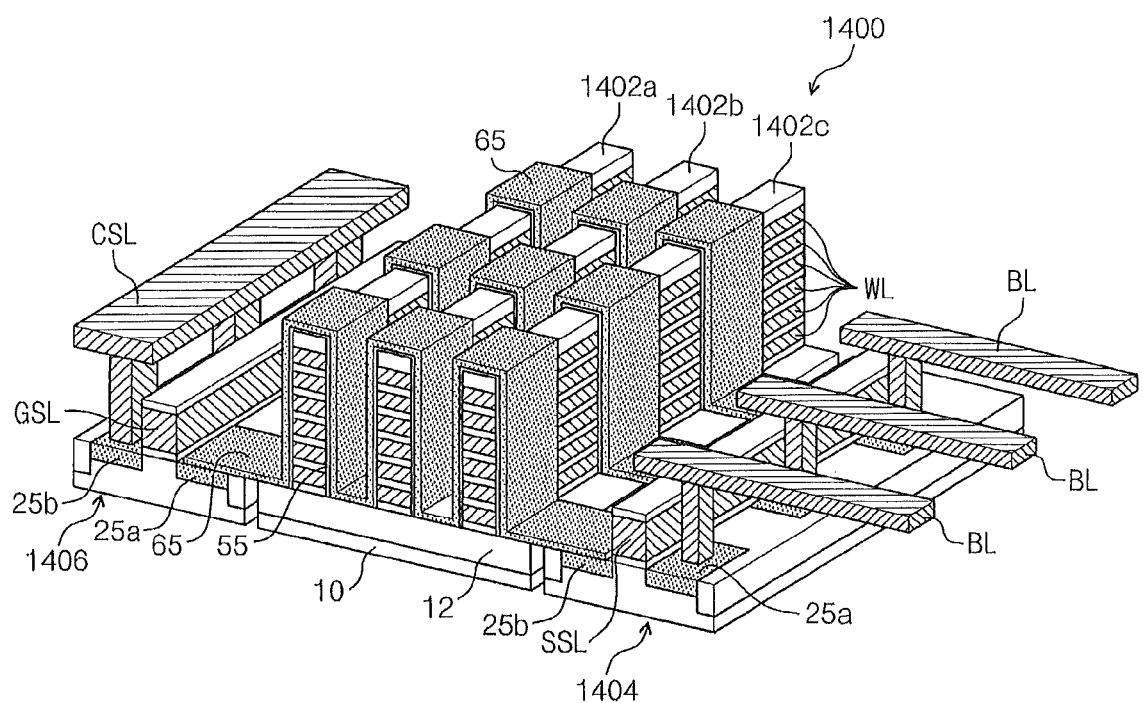
FIG. 8A is a perspective view of an integrated circuit non-volatile memory device according to an embodiment of the present invention.
Figure 8B:
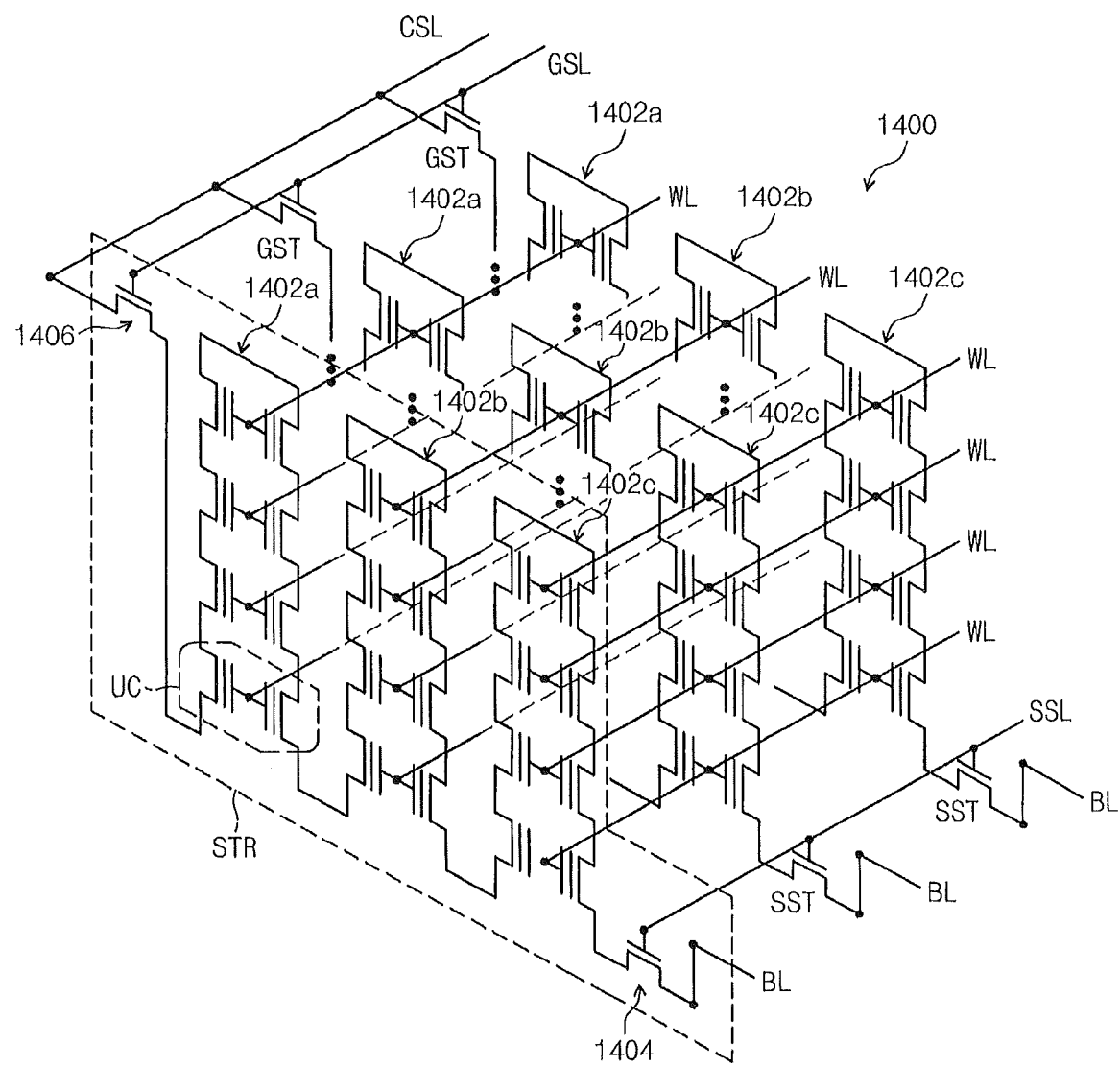
FIG. 8B is an electrical schematic of the nonvolatile memory device of FIG. 8A.

Referring now to FIGS. 8A-8B, a non-volatile memory device 1400 according to further embodiments of the invention includes a plurality of NAND-type strings (STR) of non-volatile memory cells (i.e., unit cells (UC)). In particular, FIG. 8A illustrates an embodiment of a memory device containing three (3) NAND-type strings of non-volatile memory cells. Each NAND-type string includes: three vertically-stacked arrays 1402a-1402c of charge trap memory cells on a semiconductor substrate 10; a string select transistor (SST) 1404 on a first side of the three vertically-stacked arrays 1402a-1402c; and a ground select transistor (GST) 1406 on a second side of the three vertically-stacked arrays 1402a-1402c. Each string select transistor 1404 includes a gate terminal connected to a string select line (SSL), a drain diffusion region 25a electrically connected to a corresponding bit line BL, and a source diffusion region 25b electrically connected to a first end of a respective semiconductor pattern 65. Each of the semiconductor patterns 65 may be formed as a patterned polysilicon layer, which may be annealed in a hydrogen ($H_2$) ambient. The polysilicon layer, which operates as an active layer for the memory cells within a respective NAND-type string, may have a thickness in a range from about 50Δ to about 1000Δ, and typically about 200Δ. Each ground select transistor 1406 includes a gate terminal connected to a ground select line (GSL), a drain diffusion region 25a electrically connected to a second end of a respective semiconductor pattern 65, and a source diffusion region 25b electrically connected to a common source line (CSL).

The vertically-stacked arrays 1402a-1402c of charge trap memory cells are disposed on an electrically insulating layer 12 (e.g., silicon dioxide), as illustrated. Although not shown in FIG. 8A, this electrically insulating layer 12 may be disposed in a recess, as illustrated by FIGS. 1A-1F, 1H, 4 and 5A. Each of the vertically-stacked arrays 1402a-1402c in each of the NAND-type strings of memory cells further includes a U-shaped wrap around charge storage layer 55, which supports non-volatile data retention. Each of the charge storage layers 55 contacts first and second opposing sidewalls of a respective vertical stack of word lines (WL) associated with each array. As described herein, the charge storage layer may be formed as a composite of a plurality of layers, such as a tunneling layer, a charge storage layer and a blocking layer.

Figure 9:
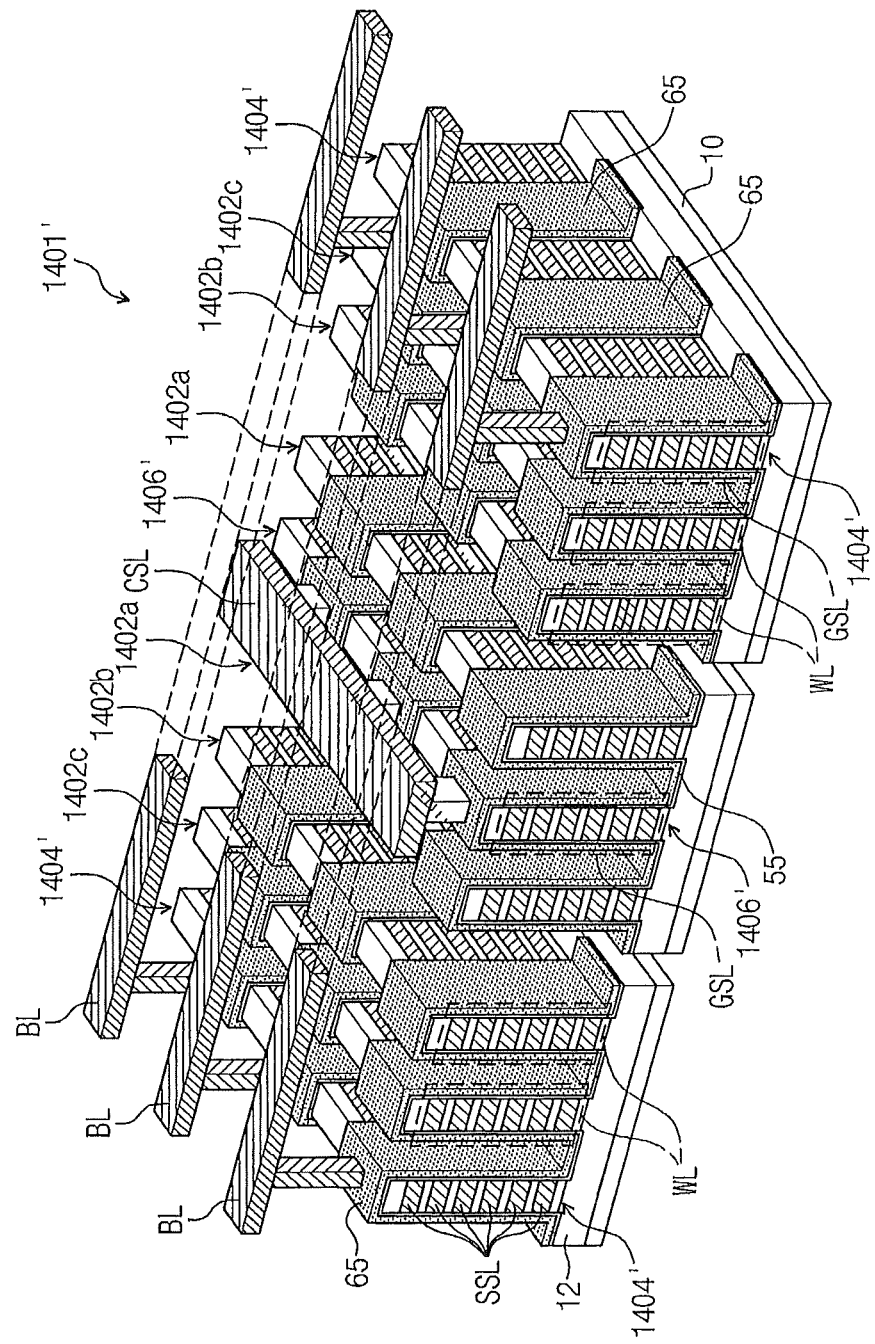
FIG. 9 is a perspective view of an integrated circuit non-volatile memory device according to an embodiment of the present invention.

FIG. 9 illustrates a non-volatile memory device 1400' according to yet another embodiment of the invention. This memory device 1400' is similar to the memory device of FIG. 8A, however, each row of string select transistors 1404 and each row of ground select transistors 1406 in FIG. 8A is replaced by a vertically-stacked array of string select transistors 1404' on a first side of a plurality of vertically-stacked arrays 1402a-1402c of charge trap memory cells and a vertically-stacked array of ground select transistors 1406' on a second side of the plurality of vertically-stacked arrays 1402a-1402c of charge trap memory cells. The vertically-stacked array of string select transistors 1404' includes a plurality of string select lines (SSLs) that are vertically-stacked relative to each other. Similarly, the vertically-stacked array of ground select transistors 1406' includes a plurality of ground select lines (GSLs) that are vertically-stacked relative to each other. Based on this configuration, the vertically-stacked array of string select transistors 1404' and the vertically-stacked array of ground select transistors 1406' are similar to the vertical configuration of the vertically-stacked arrays 1402a-1402c of charge trap memory cells. This high degree of similarity simplify overall device fabrication. In particular, based on the illustrated configuration of the string select transistors 1404' and the ground select transistors 1406', each of the charge storage layers 55 and semiconductor patterns 65 may be provided on sidewalls of the vertically-stacked array of string select transistors 1404' and the vertically-stacked array of ground select transistors 1406', so that upper level contacts may be made to a common source line (CSL) and the respective bit lines (BL) associated with each NAND-type strings.

Figure 10:
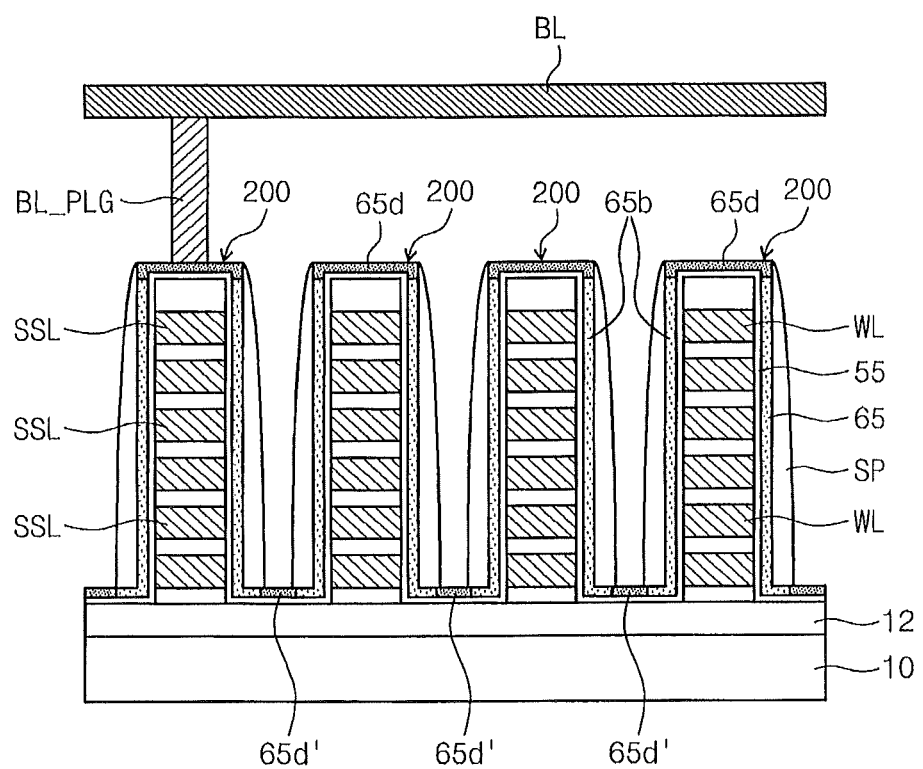
FIG. 10 is a cross-sectional view of a portion of an integrated circuit nonvolatile memory device according to an additional embodiment of the present invention.

FIG. 10 is a cross-sectional view of a portion of a NAND-type string of non-volatile memory cells, according to an embodiment of the present invention that is similar to the embodiment of FIG. 9. As illustrated, this NAND-type string includes a plurality of vertically-stacked arrays 200 of charge trap memory cells that are arranged side-by-side on an insulating layer 12, which extends on a surface of a substrate 10. This plurality of vertically-stacked arrays 200 is illustrated as including a leftmost array 200, which is configured to perform a string select operation, and three additional arrays 200. These three additional arrays are electrically connected in series and support non-volatile data storage using word lines to control selection and de-selection during programming and reading. A rightmost array (not shown) of ground select transistors (GSTs) may also be provided within each NAND-type string to thereby perform a ground select operation in response to ground select signals provided on a plurality of vertically-stacked ground select lines (GSLs). This rightmost array of ground select transistors may be similar in configuration to the leftmost array, but with a common source line (CSL) replacing separate bit lines, as shown in FIG. 9.

In particular, the leftmost array 200 includes a vertical stack of string select memory cell transistors (SSTs), which are electrically connected in series (i.e., source-to-drain). This leftmost array 200 includes a plurality of vertically spaced-apart string select lines (SSLs) that are responsive to a string select signal, which enables selection of a NAND-type string of memory cells during program and read operations. The remaining arrays 200 include respective pluralities of vertically spaced-apart word lines (WLs) that are responsive to respective word line signals. The vertical sidewalls of each of the arrays 200 are covered by a respective charge storage layer 55, which may be defined as a composite of multiple layers, a respective semiconductor pattern 65 and a pair of electrically insulating sidewall spacers SP. Each semiconductor pattern 65 is illustrated as including relatively highly doped source/drain regions 65d and 65d' and relatively lightly doped channel regions 65b that extend opposite the string select lines SSLs or word lines WLs. These sidewall spacers SP may be used as an implantation mask to support the selective formation of doped semiconductor regions 65d (e.g., N-type doped regions) by ion implantation. Thus, as illustrated at the top of the leftmost array 200, a doped semiconductor region 65d (e.g., N-type drain region) may be electrically connected to a respective bit line (BL) using a vertically extending bit line plug (BL PLG), which can be formed in an interlayer insulating layer (not shown). Similarly, a doped semiconductor region 65d' (e.g., N-type source region) may be formed adjacent a bottom of each stack of memory cell transistors. The sidewall spacers SP are formed to be sufficiently thin so that an inversion-layer channel formed in a channel region 65b at a lowermost memory cell (e.g., adjacent a bottom string select line SSL or word line WL) is sufficiently long to join with and form a non-rectifying junction with the doped semiconductor region 65d'.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An integrated circuit memory device, comprising:
a substrate having a recess therein;
a vertical stack of independently controllable word lines that extend parallel to each other across a bottom of the recess in said substrate;
first and second charge storage layers on opposite sidewalls of said vertical stack of independently controllable word lines;
first and second semiconductor channel regions on said first and second charge storage layers, respectively;
a source region electrically coupled to first ends of said first and second semiconductor channel regions; and
a drain region electrically coupled to second ends of said first and second semiconductor channel regions, wherein said first and second charge storage layers extend within a U-shaped wrap-around charge storage layer having a connecting region therein that extends between said drain region and an uppermost one of said vertical stack of independently controllable word lines.

2. The memory device of claim 1, wherein said first charge storage layer is sandwiched between a pair of electrically insulating layers that separate said first charge storage layer from said first semiconductor channel region and said vertical stack of independently controllable word lines.

3. The memory device of claim 1, wherein a lowermost one of said vertical stack of independently controllable word lines extends along a bottom and a sidewall of the recess.

4. The memory device of claim 3, wherein said source region covers the bottom of the recess.

5. The memory device of claim 1, wherein said first and second semiconductor channel regions and said drain region collectively define a U-shaped wrap-around semiconductor layer that extends on the U-shape wrap-around charge storage layer.

6. The memory device of claim 3, wherein the sidewall of the recess is a sloped sidewall that extends at a non-orthogonal angle relative to the bottom of the recess.

7. An integrated circuit memory device, comprising:
a substrate having a recess therein;
a vertical stack of independently controllable word lines that extend parallel to each other across the substrate;
first and second charge storage layers on opposite sidewalls of said vertical stack of independently controllable word lines;
first and second semiconductor channel regions on said first and second charge storage layers, respectively, wherein said first and second semiconductor channel regions contact a bottom of the recess;
first and second metal source electrodes on first ends of said first and second semiconductor channel regions, respectively, wherein said first semiconductor channel region extends between said first metal source electrode and the bottom of the recess; and
a drain region electrically coupled to second ends of said first and second semiconductor channel regions.

8. The memory device of claim 7, wherein said substrate has a recess therein; and wherein said vertical stack of independently controllable word lines is disposed within the recess.

9. An integrated circuit memory device, comprising:
a semiconductor substrate having a recess therein;
an electrically insulating layer on a bottom of the recess;
a metal source electrode on said electrically insulating layer;
a vertical stack of independently controllable word lines that extend parallel to each other, on said electrically insulating layer;
first and second charge storage layers on opposite sidewalls of said vertical stack of independently controllable word lines;
first and second semiconductor channel regions on said first and second charge storage layers, respectively, said first and second semiconductor channel regions forming metal-semiconductor junctions with said metal source electrode, wherein said first semiconductor channel region extends between said electrically insulating layer and said metal source electrode; and
a drain region electrically coupled to ends of said first and second semiconductor channel regions.

* * * * *

UNITED STATES PATENT AND TRADEMARK OFFICE
CERTIFICATE OF CORRECTION

PATENT NO. : 9,048,329 B2  
APPLICATION NO. : 14/024737  
DATED : June 2, 2015  
INVENTOR(S) : Kim et al.

Page 1 of 1

It is certified that error appears in the above-identified patent and that said Letters Patent is hereby corrected as shown below:

On Title Page:

Item 73, Assignee; Please correct:

"Samsung Electronics Co., Ltd., Republic of Korea;"

To read: -- Samsung Electronics Co., Ltd., Republic of Korea; and

The Regents of the University of California, Oakland, California --

Signed and Sealed this  
Sixteenth Day of August, 2016

Michelle K. Lee  
*Director of the United States Patent and Trademark Office*